(12) United States Patent
Tomioka

(10) Patent No.: US 7,189,962 B2
(45) Date of Patent: Mar. 13, 2007

(54) SEMICONDUCTOR RELAY APPARATUS AND WIRING BOARD FABRICATION METHOD

(75) Inventor: Taizo Tomioka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 212 days.

(21) Appl. No.: 11/059,568

(22) Filed: Feb. 17, 2005

(65) Prior Publication Data

US 2005/0189474 A1 Sep. 1, 2005

(30) Foreign Application Priority Data

Feb. 20, 2004 (JP) ............................. 2004-044233

(51) Int. Cl.
*H01J 40/14* (2006.01)
*H03K 17/78* (2006.01)

(52) U.S. Cl. ............................. 250/239; 250/214 SW

(58) Field of Classification Search ................. 250/239
See application file for complete search history.

(56) References Cited

U.S. PATENT DOCUMENTS 6,603,238 B2 * 8/2003 Sakata et al. ............... 310/307
6,614,964 B2 * 9/2003 Kuhara et al. ................ 385/49
2001/0024553 A1 * 9/2001 Nakanishi et al. ............ 385/94
2003/0123819 A1 * 7/2003 Nakanishi et al. ............ 385/92
2003/0169981 A1 * 9/2003 Nakanishi et al. ............ 385/92
2004/0137661 A1 * 7/2004 Murayama .................. 438/106

FOREIGN PATENT DOCUMENTS

JP 11-163705 6/1999

* cited by examiner

*Primary Examiner*—Georgia Epps
*Assistant Examiner*—Kevin Wyatt
(74) *Attorney, Agent, or Firm*—Oblon, Spivak, McClelland, Maier & Neustadt, P.C.

(57) ABSTRACT

Three chips, i.e., an LED, photovoltaic IC, and MOS-FET, are mounted on a silicon substrate having two projections arranged substantially parallel to each other. Each projection has a side surface formed by an inclined surface including a curve having an inflection point. The LED is mounted on an LED mounting electrode formed between the two projections, and connected, by a gold wire, to an LED connecting electrode formed between the projections. The photovoltaic IC is placed on the front-side surfaces of the projections so as to oppose the LED, and connected via gold bumps.

9 Claims, 5 Drawing Sheets

SEMICONDUCTOR RELAY APPARATUS AND WIRING BOARD FABRICATION METHOD

CROSS-REFERENCE TO RELATED APPLICATIONS

This application is based upon and claims the benefit of priority from prior Japanese Patent Application No. 2004-044233, filed Feb. 20, 2004, the entire contents of which are incorporated herein by reference.

BACKGROUND OF THE INVENTION

1. Field of the Invention

The present invention relates miniaturization of a semiconductor relay apparatus, and a method of fabricating a wiring board of the structure.

2. Description of the Related Art

Recently, to improve the reliability and decrease the size of meters such as a semiconductor tester, non-contact relays such as a semiconductor relay apparatus are often used in place of the conventional contact relays.

The operation principle of this semiconductor relay apparatus will be explained below with reference to FIG. 4. A light-emitting diode (LED) 55 and photovoltaic IC 56 oppose each other, and the photovoltaic IC 56 and a metal oxide silicon field-effect transistor (MOS-FET) 57 are connected. Light from the LED 55 is photoelectrically converted by the photovoltaic IC 56. The generated voltage is used to drive the MOS-FET 57, and turn on/off an electric current flowing between A and B in FIG. 4 in the MOS-FET 57. The LED 55 and photovoltaic IC 56 must be separated by a certain distance in order to irradiate a whole photodiode array on the surface of the photovoltaic IC 56 with the light from the LED 55.

A semiconductor tester uses several thousand relays, and a substrate mounting these relays is very expensive. By miniaturizing the semiconductor relay apparatus, it is possible to miniaturize the semiconductor tester and reduce the cost of the substrate incorporated into the tester. Therefore, miniaturization of the semiconductor relay apparatus is being required from the market.

With this market requirement as a background, various semiconductor relay apparatuses have been invented. As one prior art, a semiconductor relay apparatus introduced in Jpn. Pat. Appln. KOKAI Publication No. 11-163705 will be described below with reference to FIG. 5. This semiconductor relay apparatus has a wiring board 37. The wiring board 37 has a recess 36 formed in substantially the center, and a wiring pattern (not shown). An LED 38 as a light-emitting device is mounted on the bottom surface of the recess 36. An LED front electrode and substrate electrode (not shown) are connected by a metal wire 39. A photovoltaic IC 40 as a light-receiving device covers the opening of the recess 36, and opposes the LED 38. The photovoltaic IC 40 is bonded to the wiring board 37 via bumps 41 by flip chip bonding.

On the surface of the wiring board 37 on which the photovoltaic IC 40 is mounted, a MOS-FET 42 as an output device is bonded via bumps 43 by flip chip bonding. The photovoltaic IC 40 and MOS-FET 42 are electrically connected by a wiring pattern (not shown) on the wiring board 37. A light-transmitting resin 44 is filled between the LED 38 and photovoltaic IC 40. Portions of the photovoltaic IC 40 and MOS-FET 42 on the side of the wiring board 37 are sealed by a light-shielding resin 45.

In this semiconductor relay apparatus, the photovoltaic IC 40 and MOS-FET 42 are mounted on the wiring board 37 by flip chip bonding. This makes the package size smaller than that obtained by conventional wire bonding. Note that the MOS-FET 42 used in this semiconductor relay apparatus must be a lateral double-diffusion MOS-FET (to be referred to as a lateral MOSFET hereinafter) having a gate electrode, source electrode, and drain electrode formed on the same surface of a chip.

As shown in FIG. 6, a conventional MOS-FET having a drain electrode formed on the backside of a chip is mounted on a wiring board by forming a hole 46 for receiving an LED and two holes 47 and 48 for receiving the MOS-FET. In this structure, the MOS-FET is mounted by wire bonding. This requires a space for the chip and a space for a wire bonding capillary, so the package size significantly increases.

An example of a conventional silicon substrate fabrication method will be described below with reference to FIGS. 7A to 7F. First, holes 50 are formed from the front-side surface of a silicon wafer 49 (FIG. 7A). A silicon oxide layer 51 as an insulating film is formed on the front-side surface of the substrate by thermal oxidation (FIG. 7B). A contact film 52 such as a titanium film is formed in the holes 50 and on the front-side surface of the substrate by sputtering, and the holes 50 are filled with copper 53 by plating (FIG. 7C). The two surfaces of the substrate are then mechanically polished to open the two ends of each hole (FIG. 7D). Insulating films 54 are formed on both the front-side and backside surfaces of the substrate by chemical vapor deposition (CVD) (FIG. 7E). Necessary portions are opened by reactive ion etching (RIE) (FIG. 7F). After that, interconnections are formed on the front-side surface of the substrate as needed.

The conventional semiconductor relay apparatuses described above have the following problems.

In the semiconductor relay apparatus shown in FIG. 5, the connecting path between external connecting terminals arranged on the backside surface of the substrate and MOS-FET terminals is lengthened. This makes it impossible to obtain sufficient high-frequency signal passing characteristics.

When the substrate as shown in FIG. 6 is used, the size of the semiconductor relay apparatus is excessively increased by routing of wires, or the connecting path between external connecting terminals and MOS-FET terminals is lengthened.

Also, a small semiconductor relay apparatus substrate having this shape is difficult to fabricate by using the conventional ceramic substrate or resin substrate from the viewpoints of electrode position accuracy and flatness. If a silicon substrate having a high dimensional accuracy is selected, it is difficult to fabricate a substrate which has a large projection on its front-side surface and in which electrodes on its front-side and backside surfaces are connected by through-hole electrodes. For example, in the conventional method, both the projection and through-hole electrodes are formed from the front-side surface of a wafer. However, the wafer is difficult to hold in the polishing step of exposing the through-hole electrodes to the backside surface.

The present invention has been made in consideration of the above situation, and has as its object to provide a semiconductor relay apparatus structure which is suitable in miniaturizing a semiconductor relay apparatus without degrading its performance, and a method of fabricating a substrate.

BRIEF SUMMARY OF THE INVENTION

To solve the above problems, the present invention comprises a substrate having at least two projections on its one surface, at least one first electrode formed on a projecting end portion of each projection and an electrode formed on one surface being electrically connected by an interconnection including a portion formed on a side surface of the projection, and an electrode formed on one surface and a second electrode formed on the other surface being electrically connected by a through-hole electrode, a light-emitting device placed between the projections, a light-receiving device placed such that a light-receiving portion opposes the light-emitting device, and bonded such that an electrode is connected to the projecting end portion, an output device bonded to the substrate, a light-transmitting resin which is filled between the light-emitting device and light-receiving device, and transmits light emitted from the light-emitting device, and a light-shielding resin which covers the light-transmitting resin, light-emitting device, and light-receiving device.

In this relay apparatus, at least one side surface of the projection of the substrate is preferably an inclined surface which inclines to a surface formed by another portion of the substrate, and the interconnection is preferably formed on at least one inclined surface.

Also, an inclination angle of the inclined surface formed by the side surface of the projection is preferably smaller near the projecting end portion and near one surface of the substrate than an inclination angle in the middle of the inclined surface.

The inclined surface formed by the side surface of the projection is preferably formed by a curved surface having, in its section, a curve with an inflection point.

The second electrode is preferably formed in a rectangular trench formed in the other surface of the substrate.

The substrate is preferably primarily made of a material selected from the group consisting of silicon and a silicon compound, and the interconnections are preferably made on an insulating layer, and through-hole electrodes are preferably covered with an insulating layer.

The present invention is also a method of fabricating a wiring board having a projection on its surface, comprising steps of forming a non-through hole in a backside surface of a wafer, forming an insulating layer on the backside surface of the wafer and in the non-through hole, filling a conductor into the non-through hole, forming two projections by etching an front-side surface of the wafer, opening a bottom surface of the non-through hole from the front-side surface of the substrate, forming an insulating layer on the front-side surface of the wafer, forming a hole in a portion, which corresponds to the through hole, of the insulating layer formed on the front-side surface of the wafer, and forming electrode pads on the front-side surface of the wafer and forming a conductive pattern which connects the electrode pads.

In this method, a hardened paste containing metal particles having a diameter of 20 nm or less can be used as the conductor filled in the non-through hole.

The conductive pattern is preferably formed on the front-side surface of the wafer by coating a paste containing metal particles having a diameter of 20 nm or less.

The structure and fabrication method as described above can significantly miniaturize a semiconductor relay apparatus without decreasing the productivity or deteriorating the quality.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention and, together with the general description given above and the detailed description of the embodiments given below, serve to explain the principles of the invention.

DETAILED DESCRIPTION OF THE INVENTION

An embodiment of the present invention will be described below with reference to FIGS. 1 and 2.

Figure 1:
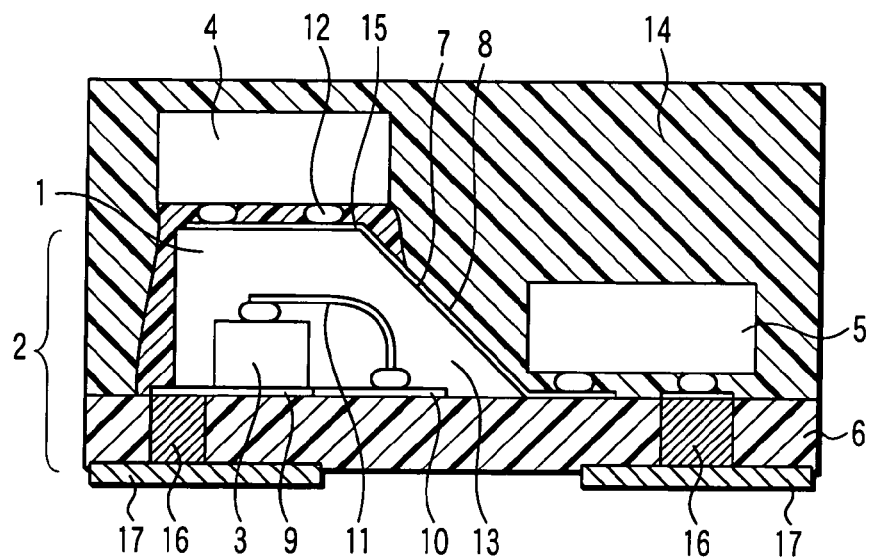
FIG. 1 is a view showing the sectional structure of a semiconductor relay apparatus according to the first embodiment of the present invention.

FIG. 1 is a view showing the sectional structure of a semiconductor relay apparatus according to the first embodiment of the present invention. The outer dimensions of this semiconductor relay apparatus are 2.0×2.0×1.2 (mm$^3$). An LED 3, photovoltaic IC 4, and MOS-FET 5 are mounted on a silicon substrate 2 having two projections 1 arranged substantially parallel to each other. That is, three chips are mounted.

The dimensions of the LED 3 are 0.2×0.2×0.2 (mm$^3$). The outer dimensions of the photovoltaic IC 4 and MOS-FET 5 are the same, i.e., 0.6×1.2×0.2 (mm$^3$). The projections 1 of the silicon substrate 2 and a base plate 6 are made of a single block.

The dimensions of the base plate 6 are 2.0×2.0×0.2 (mm$^3$), and the dimensions of each projection 1 are 0.35× 0.95×0.45 (mm$^3$). Each projection 1 has an inclined surface 7 on one side surface. The inclination angle of the inclined surface 7 is about 45°.

An interconnection 8 is formed on the inclined surface 7. Note that the side surface is formed by a curved surface including a curve having an inflection point so that the interconnection 8 is not cut in the boundary between the inclined surface 7 and a flat surface. Accordingly, one end of the inclined surface 7 as the projecting end of the projection 1 and the another end of the inclined surface 7 as the proximal end of the projection 1 are connected at a slightly moderate inclination angle with respect to a surface formed by a flat portion, other than the projection 1, of the silicon substrate 2.

Electrodes on the front-side surface of the silicon substrate 2 and backside electrodes 17 are connected by through-hole electrodes 16. Each backside electrode 17 functions as an external connecting terminal. The LED 3 is mounted on an LED mounting electrode 9 formed between the two projections 1, and connected, by a gold wire 11, to an LED connecting electrode 10 formed between the projections 1. The photovoltaic IC 4 is placed on projection front-side surface 15 so as to oppose the LED 3, and connected via gold bumps 12. A photodiode array and MOS-FET driver are formed in the surface layer of the photovoltaic IC 4.

The MOS-FET 5 is placed substantially parallel to the photovoltaic IC 4 in the direction of the opening between the two projections 1. Similarly with the photovoltaic IC 4, the MOS-FET 5 is connected to the substrate electrodes via gold bumps. Substantially transparent silicone rubber 13 is injected between the LED 3 and photovoltaic IC 4. The front-side surface of the base plate 6 is entirely covered with a black epoxy resin 14.

Figure 2:
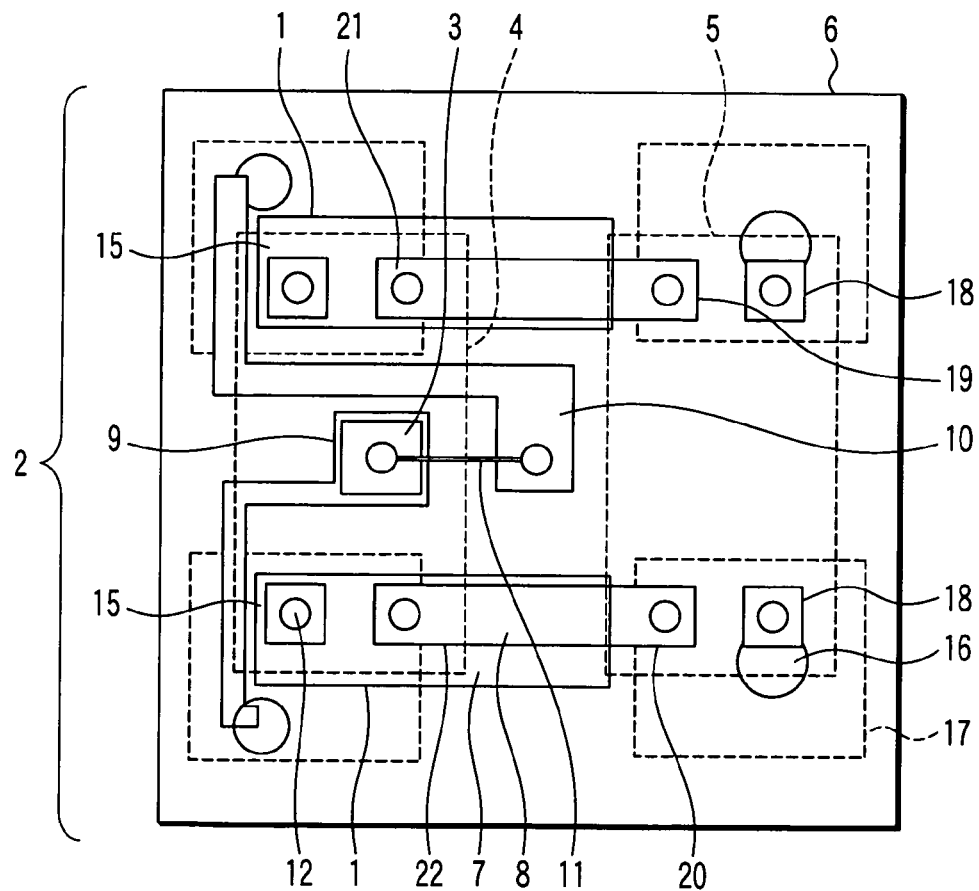
FIG. 2 is a view showing the positional relationship between the substrate electrodes and chips in the semiconductor relay apparatus.

FIG. 2 shows the positional relationship between the silicon substrate 2 and chips viewed from above the package. Four electrodes are formed on the projection front-side surface 15, and six electrodes are formed on the base plate 6. Two of the four projection front-side electrodes are connected to the electrodes on the base plate 6. Also, four of the six base electrodes are connected to the four backside electrodes 17 by the through-hole electrodes 16 which extend through the substrate. Each electrode has a four-layered arrangement including titanium/copper/nickel/gold. The MOS-FET 5 used in this embodiment is a lateral MOS-FET having two drain electrodes 18, a source electrode 19, and a gate electrode 20. The drain electrodes 18 are connected to the backside electrodes 17 by the through-hole electrodes 16. The source electrode 19 is connected to a cathode electrode 21 of the photovoltaic IC 4. The gate electrode 20 is connected to an anode electrode 22 of the photovoltaic IC 4. The photo-voltaic IC 4 has two electrodes, i.e., the cathode electrode 21 and anode electrode 22, and the two remaining electrodes are dummy electrodes for increasing the bonding strength between the chip and substrate.

This semiconductor relay apparatus operates as follows. An input signal current flows through the LED 3, and the LED 3 emits light. The photodiode array of the photovoltaic IC 4 receives this light from the LED 3, and applies the generated voltage to the gate electrode 20 of the MOS-FET 5. This voltage application turns on and off an electric current which flows between the two drain electrodes 18 of the MOS-FET 5.

FIGS. 3A to 3M show the steps of manufacturing the semiconductor relay apparatus. Approximately 3,000 substrates were fabricated per wafer by using a silicon wafer 23 having a thickness of 0.65 mm and a diameter of 150 mm. Note that FIG. 2 shows only a portion corresponding to one relay apparatus.

Figure 3A:
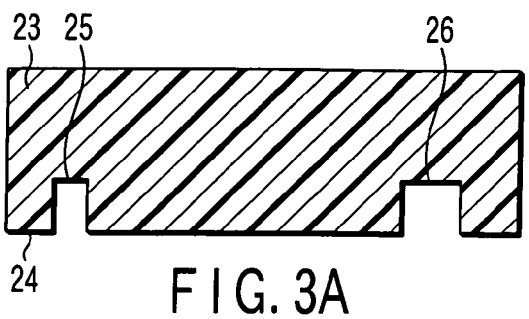
FIGS. 3A to 3M show the steps of manufacturing the semiconductor relay apparatus.

First, a hole 25 having a depth of 200 µm and a diameter of 100 µm and a hole 26 having a depth of 200 µm and a diameter of 200 µm were formed in a backside surface 24 of the silicon wafer 23 by Deep RIE (FIG. 3A). As this RIE, a method called a Bosch process was used. By this method, silicon is etched while side walls are protected by a CF deposition formed on them.

Figure 3B:
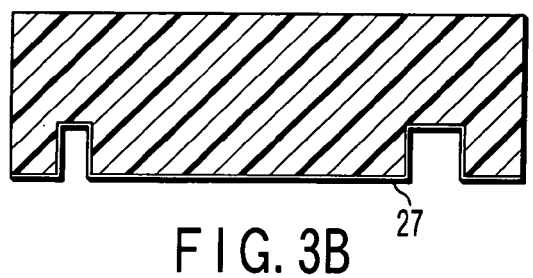
Figure 3C:
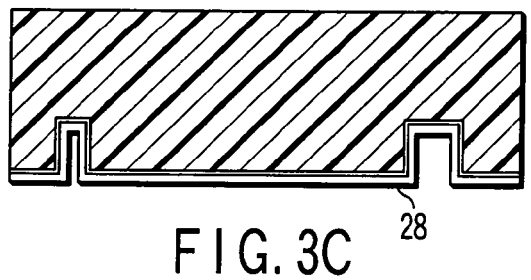
Figure 3D:
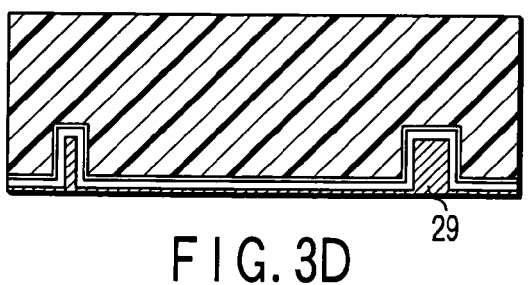
Figure 3E:
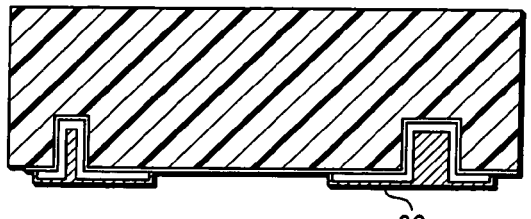

Then, a thermal oxide film 27 about 1 µm thick was formed on the entire backside surface including the holes 25 and 26 (FIG. 3B). A 100-nm thick titanium layer was formed on the entire backside surface by sputtering, and a 300-nm thick copper layer was formed on the titanium layer. That is, a 400-nm thick metal film 28 made of titanium and copper was formed on the entire backside surface (FIG. 3C). After that, electroplating was performed to fill copper 29 into the holes 25 and 26, and form a 10 µm thick copper film on the entire backside surface (FIG. 3D). Unnecessary portions except for the holes 25 and 26 and backside electrodes were removed by wet etching, thereby forming backside electrodes 30 (FIG. 3E).

Figure 3F:
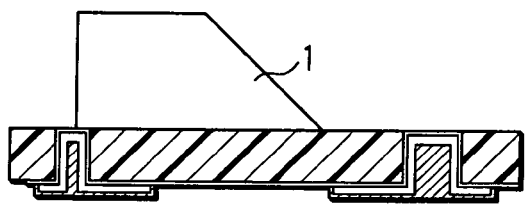
Figure 3G:
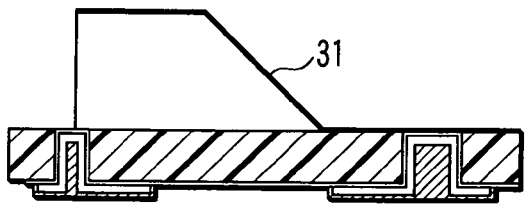

After the processes (FIGS. 3A to 3E) performed from the backside surface as one surface were completed, silicon was processed from the front-side surface of the wafer by Deep RIE so that two projections 1 remained (FIG. 3F). A silicon oxide film 31 about 1 µm thick was formed on the processed surface by plasma chemical vapor deposition (P-CVD) (FIG. 3G).

Figure 3H:
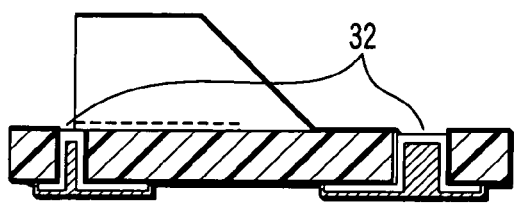
Figure 3I:
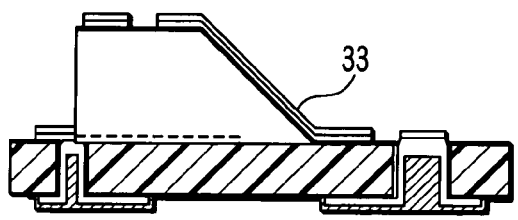

Subsequently, holes are formed from the front-side surface in portions 32 corresponding to the holes 25 and 26 by using RIE (FIG. 3H). A 10-nm thick titanium layer was formed on the entire front-side surface by sputtering, and a 300-nm thick copper layer was formed on the titanium layer. That is, a 310-nm thick metal film 33 made of titanium and copper was formed on the entire front-side surface. Unnecessary portions of the metal film 33 were removed by wet etching (FIG. 3I). In this etching, resist coating was performed by spray coating.

Figure 3L:
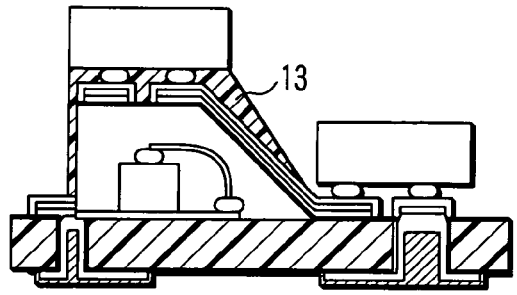
Figure 3J:
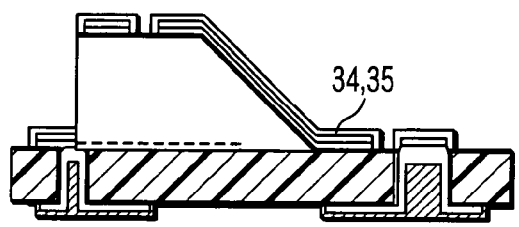

A 1 µm thick nickel plating film 34 and 0.5 µm thick gold plating film 35 were formed on the front-side and backside surfaces of the wafer (FIG. 3J). Note that both the nickel film and gold film were formed by electroless plating.

An electrode 9 between the two projections 1 on a silicon substrate 2 was coated with a conductive silver paste, and an LED 3 was mounted on this electrode. The LED 3 had electrodes on the front-side and backside surfaces of the chip. After the LED 3 was thus mounted, the silver paste was hardened by heating at 150° C. for 5 min. The electrode on the front-side surface of the LED 3 and the electrode 10 between the two projections 1 were connected by wire bonding.

In normal wire bonding, a wire is connected from the chip electrode to the substrate electrode. In this method, however, the distance between the gold wire and photovoltaic IC shortens, and the relay characteristics deteriorate. Therefore, a gold ball bump was formed on the front-side electrode of the LED 3, and the wire was connected from the substrate electrode to the chip electrode. The bump was formed on the front-side electrode of the LED 3 in order to prevent cracking of the electrode. The diameter of the gold wire used was 28 µm, and a gold ball 75 µm in diameter was formed at the distal end of the wire. The bonding temperature was 200° C.

Figure 3M:
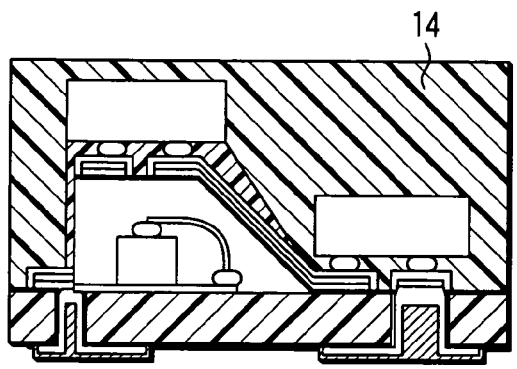
Figure 3K:
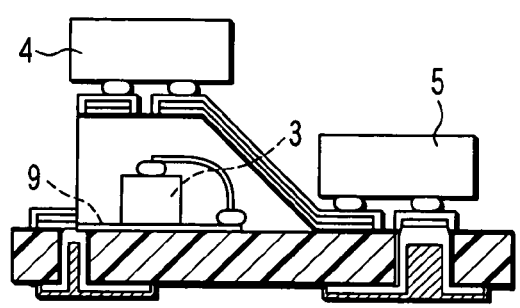
Figure 4:
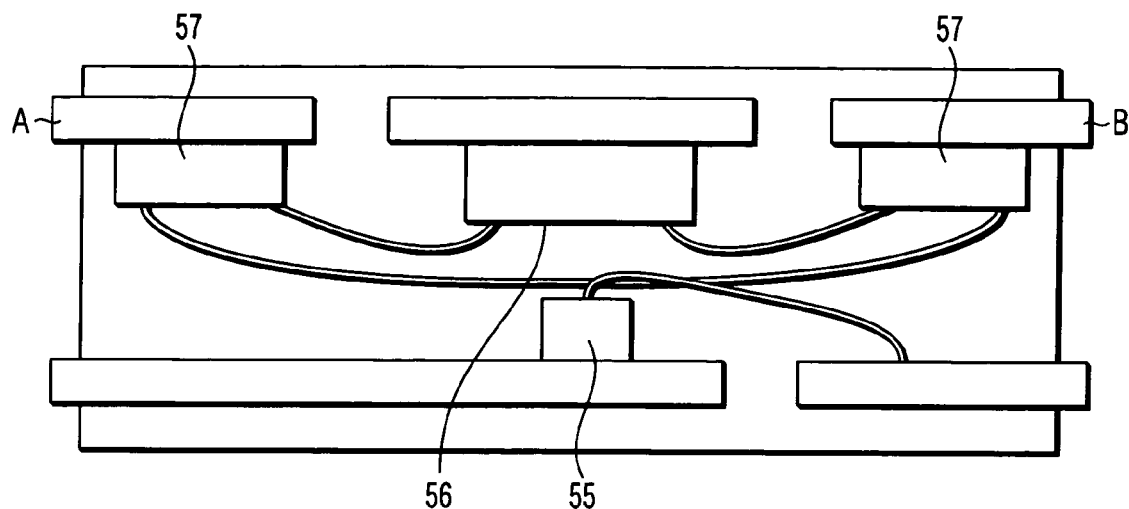
FIG. 4 is a view showing the operation principle of a conventional semiconductor relay apparatus.
Figure 5:
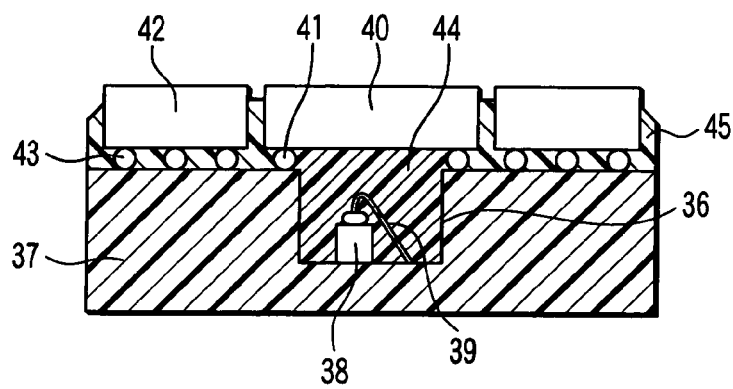
FIG. 5 is a view showing another conventional semiconductor relay apparatus.
Figure 6:
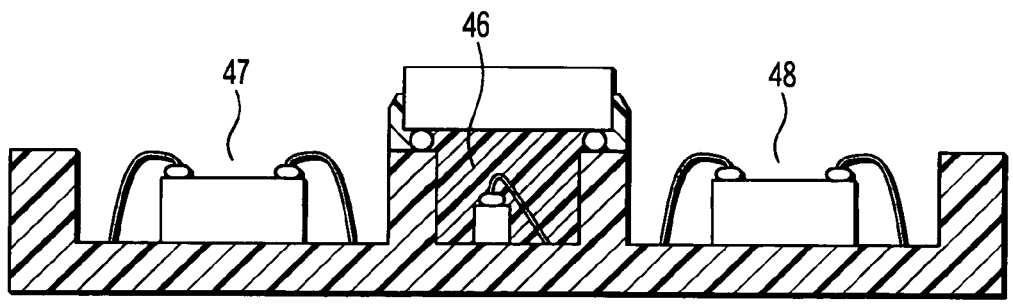
FIG. 6 is a view showing a still another conventional semiconductor relay apparatus.
Figure 7A:
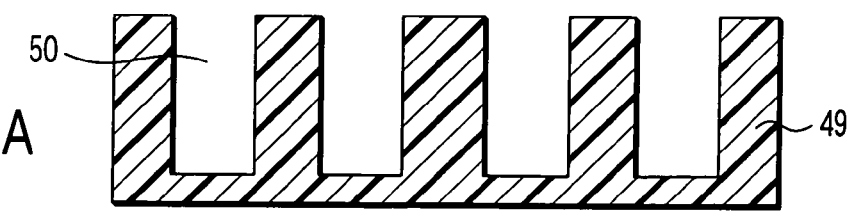
FIGS. 7A to 7F show the steps of manufacturing a conventional silicon substrate.
Figure 7B:
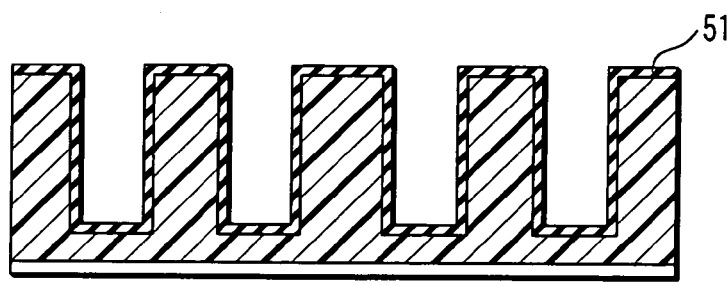
Figure 7C:
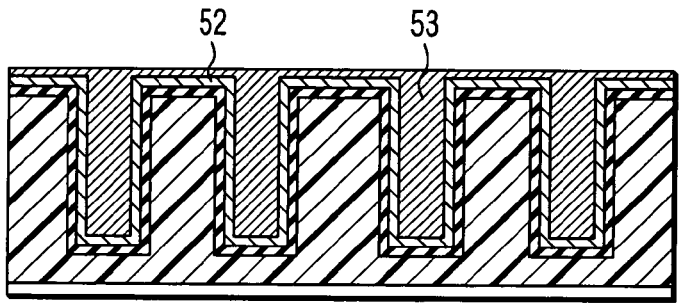
Figure 7D:
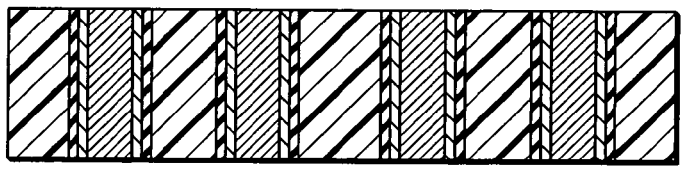
Figure 7E:
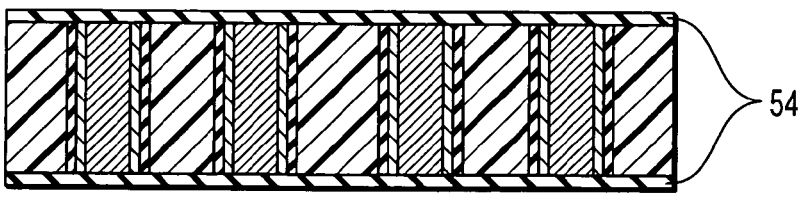
Figure 7F:
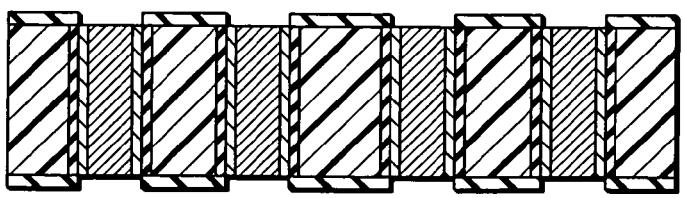

Then, the photovoltaic IC having the gold ball bump formed on the electrode beforehand was pressed with a load of 6 N by a bonding tool (not shown), and bonded by applying ultrasonic vibration for 200 ms. The amplitude of the ultrasonic vibration was about 1.5 µm. The bonding temperature was 200° C., i.e., the same as wire bonding. Under the above conditions, a shear strength of about 6 N was obtained. Subsequently, a MOS-FET having gold ball bumps formed on its electrodes beforehand was similarly bonded by flip chip bonding (FIG. 3K).

To maintain constant the optical path of light emitted from the LED 3, silicone rubber 13 was injected between the LED 3 and photovoltaic IC 4 by using a dispenser (not shown), and hardened (FIG. 3L). The entire front-side surface of the substrate was then coated with a black epoxy resin 14, the epoxy resin 14 was hardened, and the resultant substrate was cut into individual packages by using a diamond blade (FIG. 3M).

Although the embodiment of the present invention has been described above, the present invention may also be variously modified. These modifications will be explained below. In the above embodiment, the LED 3 is electrically connected by the gold wire 11 by wire bonding. However, the LED 3 may also be mounted by flip chip bonding if it is a light-emitting device having electrodes only on one surface of the chip.

Also, the photovoltaic IC and MOS-FET are mounted on the substrate by flip chip bonding after bumps are formed on the electrodes of the chips. However, these bumps may also be formed on the substrate.

In addition, flip chip bonding is performed by ultrasonic thermocompression bonding using gold ball bumps. However, the same effect may also be obtained by soldering or by bonding using a conductive resin. Although the silicone rubber 13 is filled between the LED 3 and photovoltaic IC 4, the silicone rubber 13 may also be filled to the back surface of the photovoltaic IC 4.

Furthermore, to widen the spacing between the LED 3 and photovoltaic IC 4, the portion of the substrate 23 in which the LED 3 is to be mounted may also be extended toward the other surface.

Also, the backside electrodes 30 are formed by forming the metal film 28 made of titanium and copper on the entire backside surface, filling the holes 25 and 26 with the copper 29, forming the copper film on the entire backside surface, and removing unnecessary portions except for the holes 25 and 26 and backside electrodes by wet etching. However, it is also possible to remove unnecessary portions except for the holes 25 and 26 and backside electrodes by wet etching after the metal film 28 made of titanium and copper is formed, and then fill the holes 25 and 26 with the copper 29 by electroplating.

In the above embodiment, the projections 1 on the surface are made after making the through-holes. Instead, the through-holes may be made after, for example, the projections 1 are formed on the silicon wafer 23.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A semiconductor relay apparatus comprising: a substrate having at least two projections on one surface thereof, at least one first electrode formed on a projecting end portion of each projection and an electrode formed on one surface being electrically connected by an interconnection including a portion formed on a side surface of at least one of the projections, and an electrode formed on one surface and a second electrode formed on an other surface being electrically connected by a through-hole electrode; a light-emitting device placed between the projections; a light-receiving device placed such that a light-receiving portion opposes the light-emitting device, and bonded such that an electrode is connected to projecting end portion; output device bonded to the substrate; a light-transmitting resin which is filled between the light-emitting device and light-receiving device, and transmits light emitted from the light-emitting device; and a light-shielding resin which covers the light-transmitting resin, light-emitting device, and light-receiving device.

2. An apparatus according to claim 1, wherein at least one side surface of the projection of the substrate is an inclined surface which inclines to a surface formed by another portion of the substrate, and the interconnection is formed on at least one inclined surface.

3. An apparatus according to claim 2, wherein an inclination angle of the inclined surface formed by the side surface of the projection is smaller near the projecting end portion and near one surface of the substrate than an inclination angle in a middle of the inclined surface.

4. An apparatus according to claim 2, wherein the inclined surface formed by the side surface of the projection is formed by a curved surface having, in a section thereof, a curve with an inflection point.

5. An apparatus according to claim 1, wherein the second electrode is formed in a rectangular trench formed in the other surface of the substrate.

6. An apparatus according to claim 1, wherein the substrate is primarily made of material selected from the group consisting of silicon and a silicon compound, and the interconnection is preferably made on an insulating layer, and the through-hole electrode is preferably covered with an insulating layer.

7. A method of fabricating a wiring board having a projection on a surface thereof, comprising steps of:
    forming a non-through hole in a backside surface of a wafer;
    forming an insulating layer on the backside surface of the wafer and in the non-through hole;
    filling a conductor into the non-through hole;
    forming two projections by etching a front-side surface of the wafer;
    opening a bottom surface of the non-through hole from the front-side surface of the substrate;
    forming an insulating layer on the front-side surface of the wafer;
    forming a hole in a portion, which corresponds to the through hole, of the insulating layer formed on the front-side surface of the wafer; and
    forming electrode pads on the front-side surface of the wafer and forming a conductive pattern which connects the electrode pads.

8. A method according to claim 7, wherein a hardened paste containing metal particles having a diameter of not more than 20 nm is used as the conductor filled in the non-through hole.

9. A method according to claim 7, wherein the conductive pattern is formed on the front-side surface of the wafer by coating a paste containing metal particles having a diameter of not more than 20 nm.

* * * * *